US009689562B2

(12) United States Patent
Volpato et al.

(10) Patent No.: US 9,689,562 B2
(45) Date of Patent: Jun. 27, 2017

(54) METHOD OF INSTALLING AT LEAST ONE LIGHTING MODULE

(71) Applicant: OSRAM GmbH, Munich (DE)

(72) Inventors: Luca Volpato, Preganziol (IT); Simone Massaro, Venice (IT); Simon Bobbo, Chirignago (IT)

(73) Assignee: OSRAM GmbH, Munich (DE)

( * ) Notice: Subject to any disclaimer, the term of this patent is extended or adjusted under 35 U.S.C. 154(b) by 462 days.

(21) Appl. No.: 14/093,600

(22) Filed: Dec. 2, 2013

(65) Prior Publication Data

US 2014/0196284 A1 Jul. 17, 2014

(30) Foreign Application Priority Data

Jan. 11, 2013 (IT) .............................. TO2013A0020

(51) Int. Cl.
*H05K 3/30* (2006.01)
*F21V 21/08* (2006.01)
(Continued)

(52) U.S. Cl.
CPC ............ *F21V 21/0832* (2013.01); *F21S 2/00* (2013.01); *F21S 4/28* (2016.01); *F21V 21/002* (2013.01);
(Continued)

(58) Field of Classification Search
CPC .. F21V 21/002; F21V 21/088; F21V 21/0832; F21S 2/00; F21S 4/28; F21Y 2101/02
(Continued)

(56) References Cited

U.S. PATENT DOCUMENTS

| | | | | |
|---|---|---|---|---|
| 7,237,925 B2 * | 7/2007 | Mayer | F21V 3/04 362/240 |
| 7,815,341 B2 * | 10/2010 | Steedly | F21V 19/0055 362/217.01 |

(Continued)

FOREIGN PATENT DOCUMENTS

| | | |
|---|---|---|
| AU | 2010241445 A1 | 6/2011 |
| DE | 102007043716 A1 | 3/2009 |

(Continued)

OTHER PUBLICATIONS

European Search Report based on Application No. 13198673.9 (6 Pages) dated Jun. 16, 2015 (Reference Purpose Only).
Italian Search Report, dated Sep. 5, 2013; 2 pages.

*Primary Examiner* — Paul D Kim
(74) *Attorney, Agent, or Firm* — Viering, Jentschura & Partner mbB

(57) ABSTRACT

A lighting module includes a ribbon-like containment body with a web wall having a first and a second face opposite to each other and a pair of side walls extending sidewise of the first face of the web wall to define a channel-like shape of the containment body, a ribbon-like mounting board for mounting light radiation sources, the mounting board being arranged in the channel-like shape of the containment body with a mounting surface facing away from the first face of the web wall of the containment body, and a light radiation source mounted on the mounting surface of the board for projecting light radiation from the channel-like shape of the containment body. The lighting module includes a pair of hook-like profiles protruding from and along the second face of the web wall of the containment body to permit mounting of the lighting module by hooking to a mounting element.

16 Claims, 5 Drawing Sheets

(51) Int. Cl.

| | |
|---|---|
| ***F21V 21/088*** | (2006.01) |
| ***F21S 2/00*** | (2016.01) |
| ***F21V 21/002*** | (2006.01) |
| ***F21S 4/28*** | (2016.01) |
| *F21Y 115/10* | (2016.01) |

(52) U.S. Cl.
CPC ......... *F21V 21/088* (2013.01); *F21Y 2115/10* (2016.08); *Y10T 29/4913* (2015.01)

(58) Field of Classification Search
USPC ........... 29/622, 831, 846, 854; 362/319–333, 362/352, 508–512, 581
See application file for complete search history.

(56) References Cited

U.S. PATENT DOCUMENTS

| | | | | |
|---|---|---|---|---|
| 7,857,482 | B2 * | 12/2010 | Reo | F21V 5/008 362/225 |
| 8,764,220 | B2 * | 7/2014 | Chan | F21V 15/013 362/217.02 |
| 8,845,131 | B2 * | 9/2014 | Ferrie | F21S 4/20 362/249.02 |
| 2003/0223235 | A1 | 12/2003 | Mohacsi et al. | |
| 2009/0279299 | A1 | 11/2009 | Yang | |

FOREIGN PATENT DOCUMENTS

| | | | |
|---|---|---|---|
| KR | 101084979 | B1 | 11/2011 |
| WO | 2011139768 | A2 | 11/2011 |

* cited by examiner

METHOD OF INSTALLING AT LEAST ONE LIGHTING MODULE

CROSS-REFERENCE TO RELATED APPLICATION

This application claims priority to Italian Patent Application Serial No. TO2013A000020, which was filed Jan. 11, 2013, and is incorporated herein by reference in its entirety.

TECHNICAL FIELD

Various embodiments relate generally to lighting modules. Various embodiments may relate to flex lighting modules using solid-state sources, for example of the LED type, as light radiation sources.

BACKGROUND

Current techniques for installing flex lighting modules, for example of the LED type, possibly with IP protection (Ingress Protection), provide for the use of:

- adhesive ribbons, which may not be able to adhere to some surfaces and/or exhibit poor reliability over time,
- forks or clips, which, in addition to possibly being difficult and temporally onerous to install, can give rise to negative esthetic effects,
- rails or tracks, which can give rise to negative esthetic effects, a loss in installation flexibility and/or a possible degradation in optical performance owing to particular geometries of the rails or tracks.

One installation technique can be suspended mounting. This may be effected using devices which may be rather cumbersome and, at least in certain cases, not particularly esthetically pleasing.

In addition, suspended mounting may involve various negative aspects, for example:

- the concentration of the light radiation sources at the center of each segment, which may limit the homogeneity of the resultant lighting effect,
- reduced flexibility, in particular with respect to the possible implementation of complex mounting and lighting configurations, and
- the need for the suspension structures to be able to support the lighting devices so as to prevent them from falling down, including as a result of exposure to atmospheric agents (wind, vibrations, etc.).

SUMMARY

A lighting module includes a ribbon-like containment body with a web wall having a first and a second face opposite to each other and a pair of side walls extending sidewise of the first face of the web wall to define a channel-like shape of the containment body, a ribbon-like mounting board for mounting light radiation sources, the mounting board being arranged in the channel-like shape of the containment body with a mounting surface facing away from the first face of the web wall of the containment body, and a light radiation source mounted on the mounting surface of the board for projecting light radiation from the channel-like shape of the containment body. The lighting module includes a pair of hook-like profiles protruding from and along the second face of the web wall of the containment body to permit mounting of the lighting module by hooking to a mounting element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
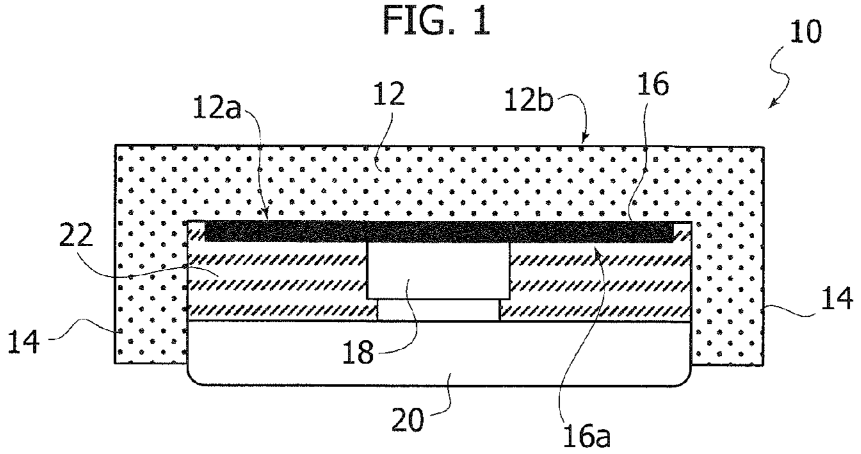
FIG. 1 shows, in an ideal cross-sectional view, the base structure of a lighting module.

In the following description, various specific details aimed at providing a fuller understanding of various exemplary embodiments are explained. The embodiments may be implemented without one or more of the specific details or using other methods, components, materials, etc. In other cases, known structures, materials or operations are not shown or described in detail so that the various aspects of the embodiments may be understood more clearly. The reference to "an embodiment" in the context of this description indicates that a particular configuration, structure or feature described in relation to the embodiment is included in at least one embodiment. Therefore, phrases such as "in one embodiment", which may occur at various points in this description, do not necessarily refer to the same embodiment. Moreover, particular forms, structures or features may be combined in any suitable manner in one or more embodiments.

The reference signs used here are provided solely for the reader's convenience and therefore do not define the scope of protection or ambit of the embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may overcome the disadvantages outlined above.

Various embodiments make it possible to achieve this object on account of a lighting module having the features indicated specifically in the claims which follow.

Various embodiments can also relate to a corresponding installation method.

The claims form an integral part of the technical teaching provided here in relation to the invention.

Various embodiments make it possible to easily and quickly mount flex lighting modules (possibly with IP protection), for external and internal applications, for general lighting, decorative lighting, cavity lighting, vault lighting, for illuminating architectural features, for highlighting borders and for delimiting roads, passageways and tracks.

Various embodiments may also be suitable for suspended installation, both inside and outside, with the possibility to also ensure, in addition to IP protection, the reliability and safety of the installation with a reduced negative esthetic impact on the external environment.

Various embodiments make it possible to install flex modules, for example of the light emitting diode (LED) type, with IP protection owing to a mechanical interface embedded in the profile of the modules so as to allow strong and reliable connection to a support.

Various embodiments are compatible with flexible supports, including in terms of the electricity supply, and/or make it possible to ensure a degree of IP protection, for example up to level IP 67.

Various embodiments make it possible to supply the modules with constant electrical voltage, ensuring a high flexibility both regarding the number of light radiation sources which can be installed and regarding the corresponding supply/control units which can be used for the installation.

FIG. 1 shows a possible base structure of a flex lighting module, denoted as a whole by 10, which can be used in combination with lighting sources such as, for example, solid-state lighting sources such as LED lighting sources.

FIG. 1 to FIG. 5 show the module 10 in an ideal cross-sectional view; as a matter of interest here, the module 10 can be regarded as having an indefinite length.

In the example to which FIG. 1 refers, the module 10 includes a ribbon-like containment body made of flexible material, for example in the form of a profiled member made of flexible material, such as silicone, having a channel-like form in which, in various embodiments, it is possible to identify the following:

- a web wall 12 having a first and a second face 12*a*, 12*b* opposite to each other, and
- two side walls 14 extending sidewise of the first face 12*a* of the web wall 12 to give the containment body 12, 14 a general channel-like shape.

In various embodiments, a ribbon-like mounting board 16 for mounting light radiation sources 18 can be arranged inside the aforementioned channel-like shape of the containment body 12, 14: as already mentioned, in various embodiments these light radiation sources may be, for example, solid-state light radiation sources such as LED light radiation sources.

In various embodiments, the mounting board 16 may be in the form of a ribbon-like component with a structure which substantially resembles a printed circuit board (PCB).

In various embodiments, the mounting board 16 can be arranged in contact with or in the proximity of the first face 12*a* of the web wall 12 of the channel-like shape of the containment body and have a mounting surface 16*a* positioned opposite to (that is facing away from) the first face 12*a* of the web wall 12.

In various embodiments, one or more light radiation sources 18 can be mounted on the mounting surface 16*a*, the radiation of which is intended to be projected from the channel-like shape of the containment body 12, 14.

In various embodiments, the light radiation sources 18 can be formed by LEDs and/or can be mounted on the surface 16*a* of the board 16 at fixed distances (uniform or non-uniform, depending on the mounting requirements).

In various embodiments, the light radiation source or sources 18 can have an associated structure 20 with optical characteristics, for example made of transparent material and/or able to display an optical lens effect, possibly on account of the presence of (integral or separate) lens portions.

In various embodiments, the structure 20 too can have a ribbon-like general shape and can be mounted in such a way as to close (for example sealingly) the channel-like shape of the containment body 12, 14 so as to ensure protection (for example protection against the ingress of external agents or IP) of the light radiation sources 18 and of the inside of the module 10 as a whole.

In various embodiments, the internal volume of the channel-like shape of the containment body 12, 14 which is not occupied by the light radiation sources 18 (and by any circuits associated therewith) can be filled with a potting compound 22, for example made of silicone material, which is able to contribute to the protective characteristics of the module 10.

It will moreover be understood that the base structure of the module 10 shown in FIG. 1 (and illustrated analogously in FIG. 2 to FIG. 5, in which parts, components and elements identical or equivalent to those described above in relation to FIG. 1 are denoted by the same reference signs and therefore will not be described again for the sake of conciseness) has an exemplary rather than imperative character for the purposes of realizing the embodiments.

FIG. 2 to FIG. 5, too, can therefore be regarded as ideal cross-sectional views of a module 10 of indefinite length per se.

FIG. 2 to FIG. 5 show by way of example the possibility of providing a pair of (continuous or discontinuous) hook-like profiles 24 emerging from the second face 12*b* of the web wall 12 of the containment body.

In various embodiments, the profiles 24 can have a hook-like (for example L-shaped) cross section with a proximal or shank portion extending away from the face 12*b* and a distal or head portion 24*a* extending in a direction substantially parallel to the plane of the face 12*b*.

As is explained more clearly hereinbelow, the profiles 24 are intended to form hooking formations allowing the installation of the flex module 10 on mounting elements according to embodiments.

In the exemplary embodiments under consideration here, which are so formed, the profiles 24 extend at the lateral edges of the face 12*b* such as to give the containment body of the module 10 an approximately H-shaped cross-sectional profile.

In the exemplary embodiments under consideration here, which are so formed, the profiles 24 have distal portions 24*a* which are oriented toward the inside of the module 10, and therefore toward one another, so as to jointly define a clamping formation that can be defined approximately as a clamp-like (or pincers-like) hooking formation.

In various embodiments, the distal parts 24*a* can face in an opposite direction, that is toward the outside of the module 10. In this case, the hooking solutions will be complementary with respect to those described by way of example here with reference to embodiments in which the two profiles 24 have distal parts 24*a* directed toward one another, that is oriented toward the inside of the profile of the module 10.

In various embodiments, the profiles 24 can be made in one piece (for example in a single extrusion process) with the containment body 12, 14, and in this way can be formed from the same flexible material (for example silicone material).

In various embodiments, the profiles 24 (be they made in one piece with the containment body 12, 14 or forming a separate part from said containment body) can be made of a flexible material, both so as not to affect the features of overall flexibility of the module 10 and to facilitate the hooking installation according to the methods described more clearly hereinbelow.

In various embodiments, the profiles 24 can be made in such a way that they do not give rise to possible interferences, including of an optical nature, with the light sources 18 and any optical elements 20 associated therewith: for example, in the embodiments described by way of example, the profiles 24 are located on the opposite side of the module 10 from the light radiation sources 18.

Figure 2:
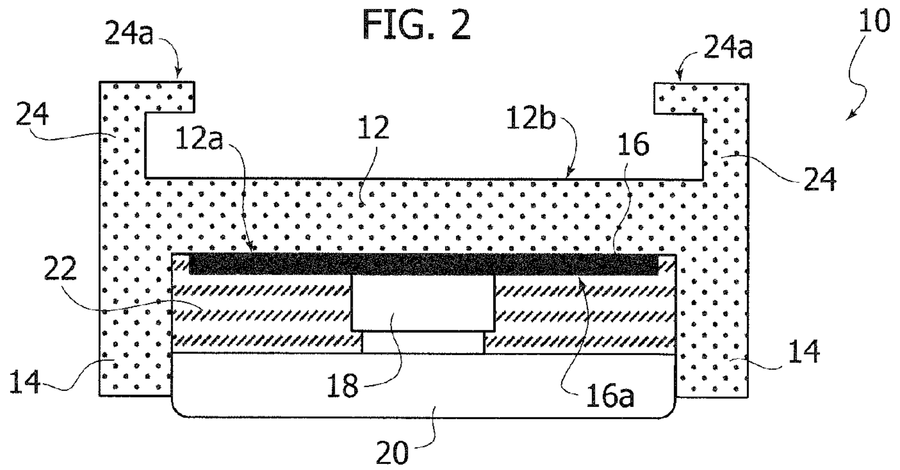
FIG. 2 shows a lighting module according to embodiments.
Figure 3:
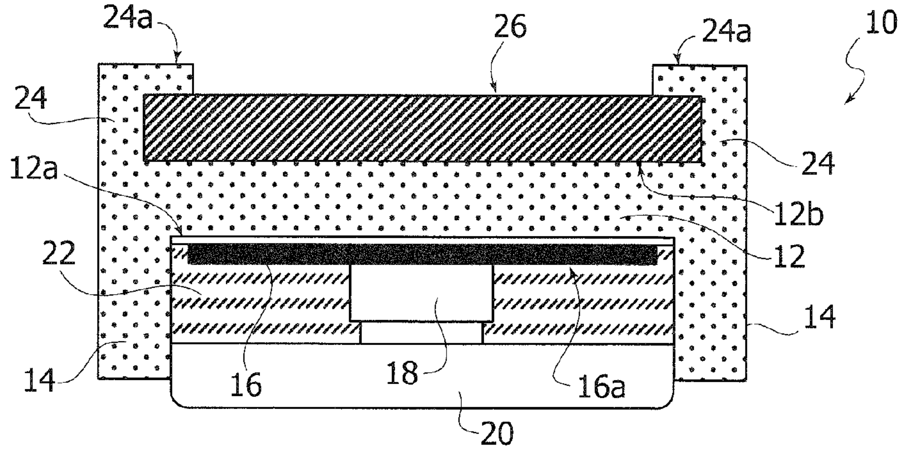
FIGS. 3 to 5 show various possible mounting solutions according to embodiments.
Figure 4:
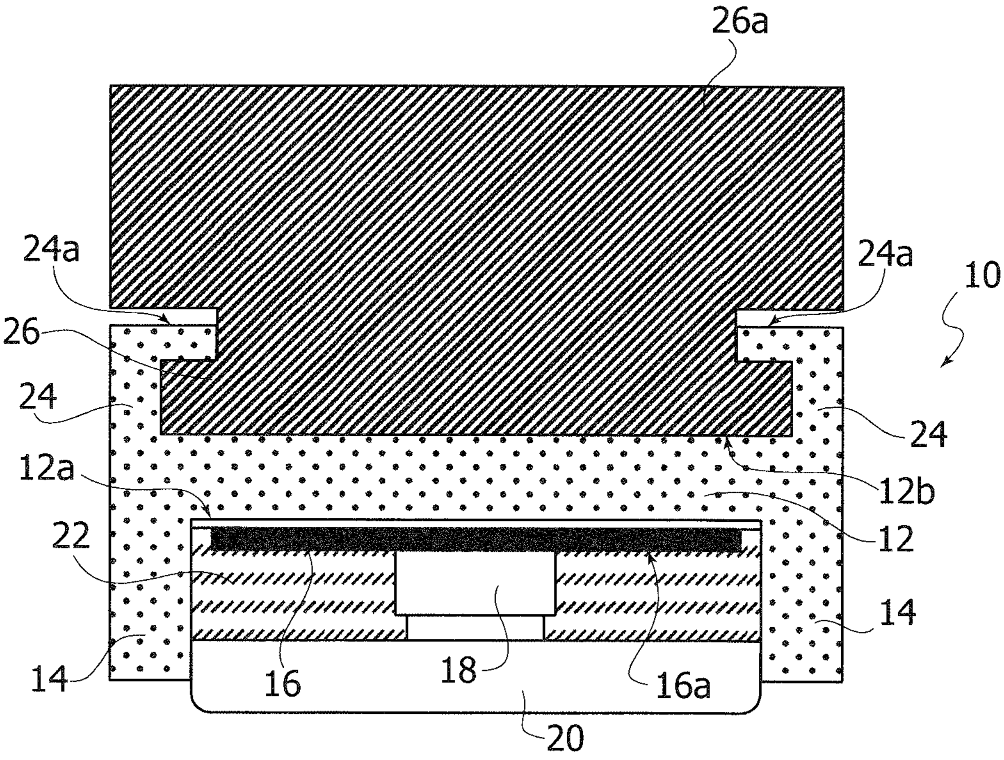
Figure 5:
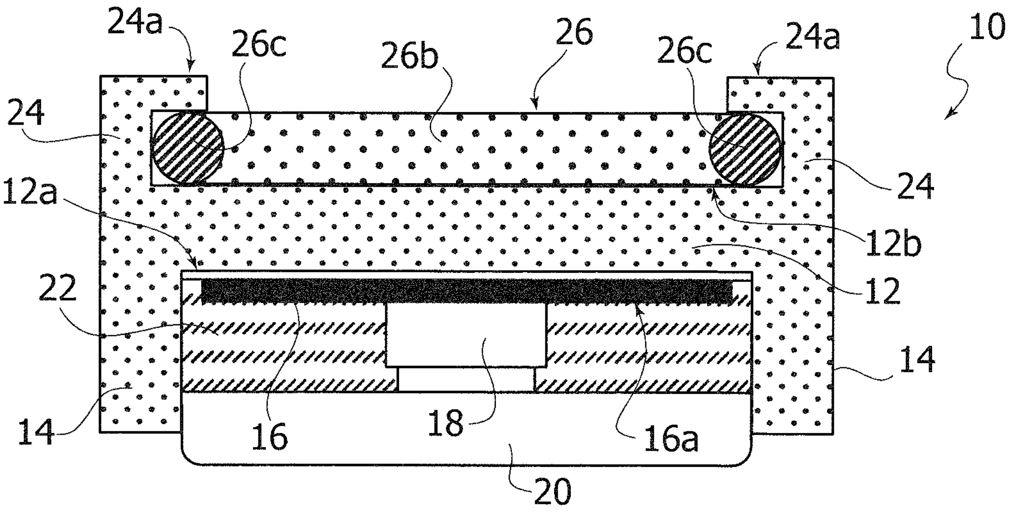

FIG. 3 to FIG. 5 show various possible ways of mounting, by hooking, a module 10 of the type described by way of example with reference to FIG. 2; this can be effected on account of the use of mounting elements 26, which also have a ribbon-like general shape.

In various exemplary embodiments, this can be effected by virtue of the fact that the mounting element (or support) 26 has a width corresponding to (virtually equal to or slightly smaller than) the distance between the profiles 24 (more precisely between the root or proximal parts thereof) so as to allow mounting of the module 10 by hooking to the element 26.

FIG. 3 shows by way of example the possibility to use, as the mounting element 26, a strip or band, for example made of molded or extruded plastic material. The element 26 can be fixed—by different methods—to a support or can be hung like a catenary or "taut" to allow suspended mounting.

FIG. 3 makes it possible to understand the fact that, in the aforementioned configuration of hooking installation, which can be easily achieved by utilizing the elastic compliance of the profiles 24, the distal sections 24*a* of said profiles 24 embrace or tighten the external edges of the mounting strip 26 so as to ensure stable mounting of the module 10 on said strip 26.

By adopting embodiments as shown by way of example here, the module 10 is hooked with respect to the element 26 continuously along the entire length of the module 10, and this can therefore give rise to a stable coupling configuration by hooking.

FIG. 4 shows by way of example the possibility whereby, instead of being an independent element per se (for example a suspension band), the support strip 26 can form the head part of a formation profiled like a T emerging from a support 26*a*.

The support 26*a* can be a type of straight edge which can be fixed on a mounting surface in such a way that it is virtually completely concealed by the module 10, without esthetic effects which can be considered unpleasant.

FIG. 5 shows by way of example the possibility to realize a mounting element 26 in the form of a composite strip including, for example, a mass of insulating material (plastic, rubber, silicone) 26*b*, in which there are embedded, for example along the opposite sides, two wire-like elements 26*c*, that can include, for example, electrically conductive wires (for example braided cables).

In addition to being able to constitute structural elements of the element 26, the elements 26*c* can if necessary constitute conductors that can convey electric signals of varying nature along the module 10 (supply and/or control of the sources 18, sensing/retroaction signals from the sources 18, etc.).

In this respect, it will be understood that the number and the lateral positioning of the conductors 26*c* shown by way of example in FIG. 5 are not imperative features per se: in various embodiments, it is thus possible, for example, to insert conductors 26*c* into the mounting element 26 in a different position and/or in a different number (more or less), for example to implement modules 10 which allow more operating "phases".

Figure 6:
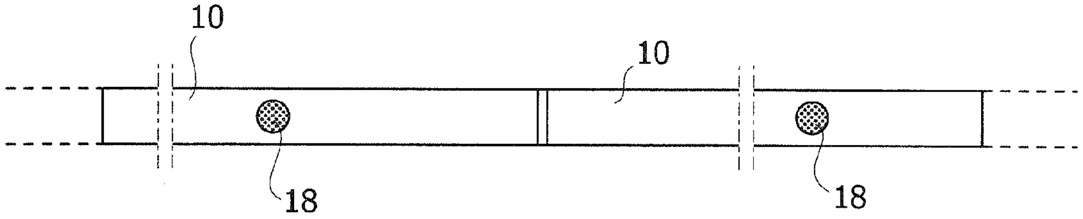
FIGS. 6 to 9 show by way of example mounting possibilities of embodiments.
Figure 7:
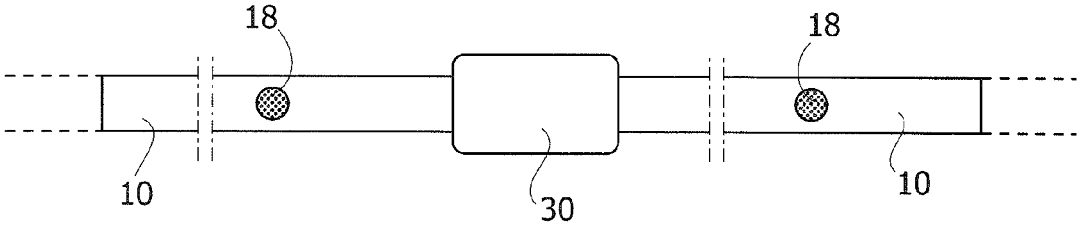

In various embodiments, a number of modules 10 can therefore be connected both in mechanical terms and in electrical terms (always with it being possible to preserve protection of the IP type, for example), as shown schematically in FIG. 6 and FIG. 7.

These figures show by way of example two modules 10 bearing respective lighting sources (for example of the LED type) 18 connected in sequence one after the other with the interposition of a connector 30.

In various embodiments, the connector 30 can be, for example, of the piercing type, i.e. it has the ability to pierce the insulating material of the module 10 so as to come into contact with the conductors 26*c*.

Figure 8:
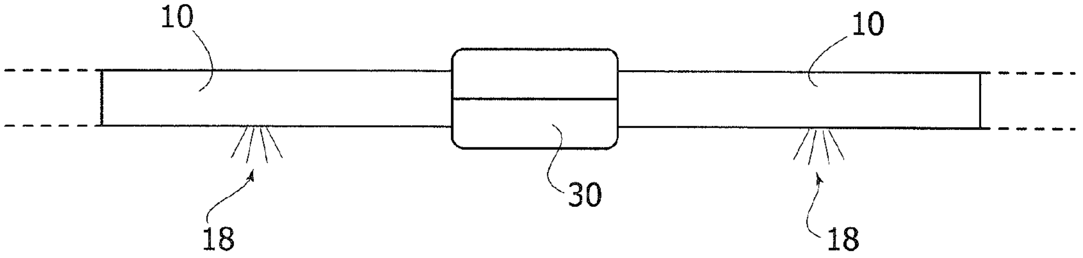
Figure 9:
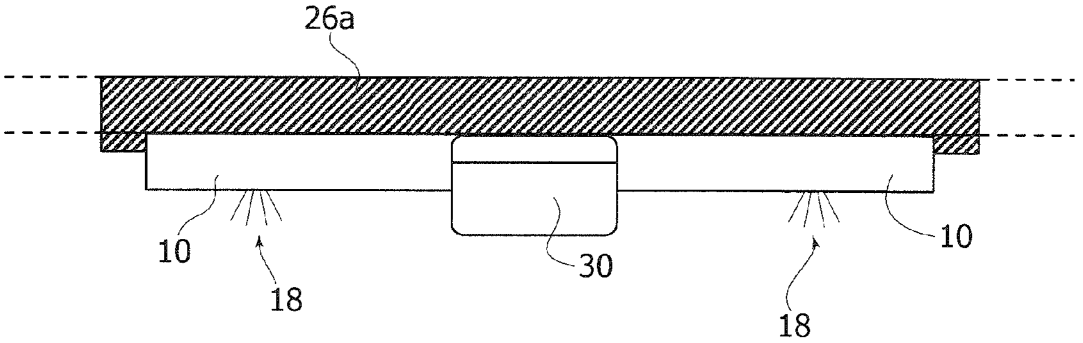

FIG. 8 and FIG. 9 show that the state of connection between modules 10 in sequence can be realized both in a suspended installation (FIG. 8) and with installation on a profiled member, for example of the type of the profile 26*a* shown in section in FIG. 4, fixed in turn on a support.

It will be understood moreover that the electrical connection between the modules 10, though representing one option, is not imperative per se: it is thus possible to conceive of a purely mechanical connection between modules 10, made using the same methods as those shown using fake electrical connectors, with it being possible in any case to realize protection of the IP type for the ends of the modules 10.

Figure 10:
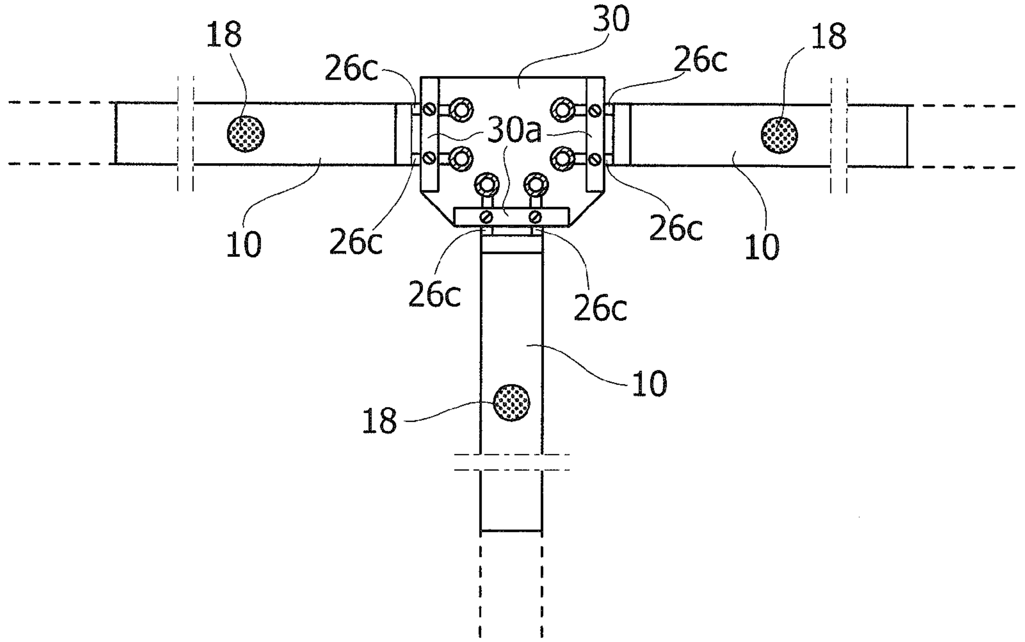
FIGS. 10 to 15 further develop the subject of installation according to various embodiments.

FIG. 10 and the subsequent figures show by way of example the fact that the possibilities for connecting modules 10 are not limited to two or more modules 10 arranged in sequence and collinear with one another, as per the illustration in FIG. 6 to FIG. 9.

Figure 11:
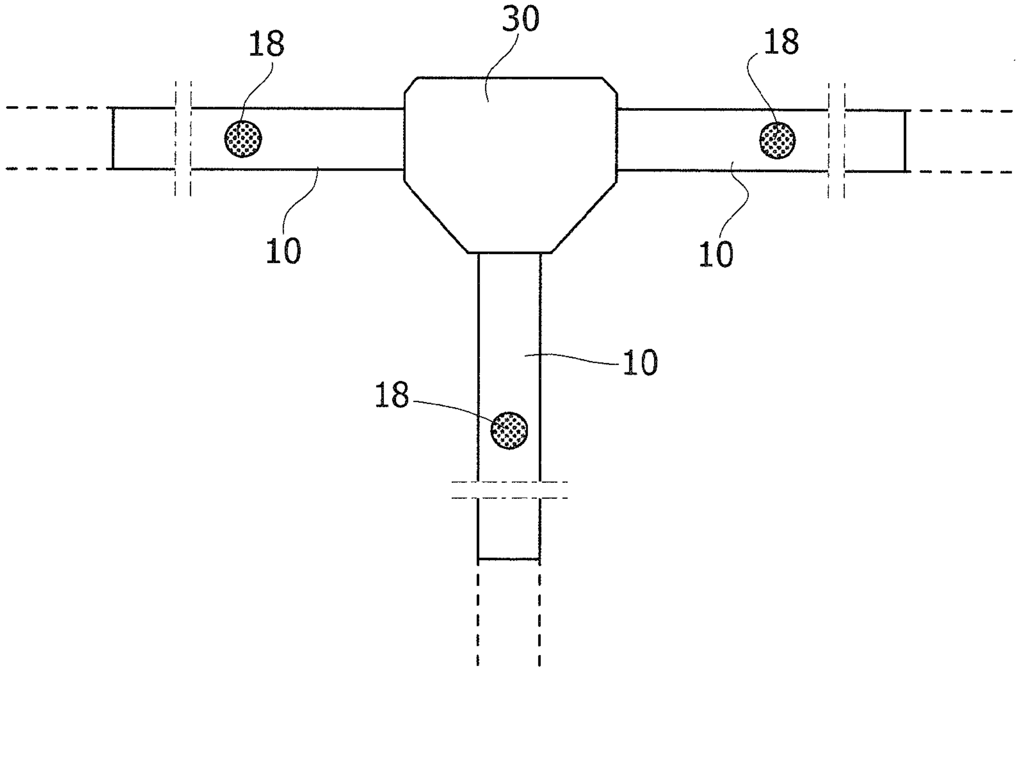

By way of example, FIG. 10 and FIG. 11 show the T-like connection of three modules 10 made by means of a connector 30 provided with fixing/clamping formations 30*a* that can cooperate with the ends of the wire-like elements 26*c*.

In various embodiments, the aforementioned connection can also include an electrical connection, which can be made for example by using fixing elements 30*a* made of electrically insulating material and by providing, within the environment of the connector 30, contact tracks, which between them can connect the wire-like elements 26*c* when the latter have the property of electrical conductors.

Figure 13:
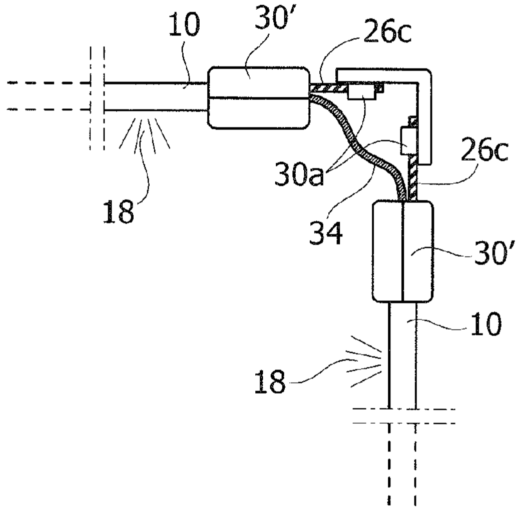
Figure 12:
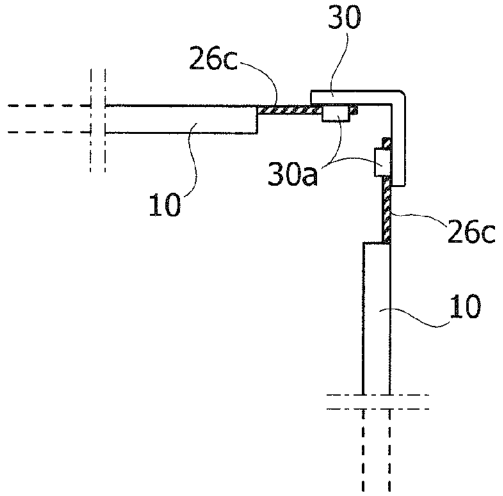
Figure 14:
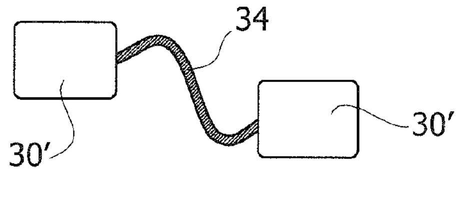

FIG. 12 to FIG. 14 show by way of example the possibility to make the L-like connection between two modules 10 which can be seen not just as acting on an (ideal) common plane—as for example in the case shown in FIG. 6 and FIG. 11—but as arranged on two orthogonal or approximately orthogonal planes (for example walls, not visible in the drawings), and are connected to one another by means of a connector element 30 with an L-like general shape (for example like a "set square") and bearing hooking/blocking elements 30*a* for the ends of the wire-like elements 26*c*.

FIG. 13 shows by way of example the possibility to make the connection shown in FIG. 12 also as an electrical connection, made using, for example, two electrical connectors 30' connected to one another by an electrical connection line or cable 34 (FIG. 14).

Figure 15:
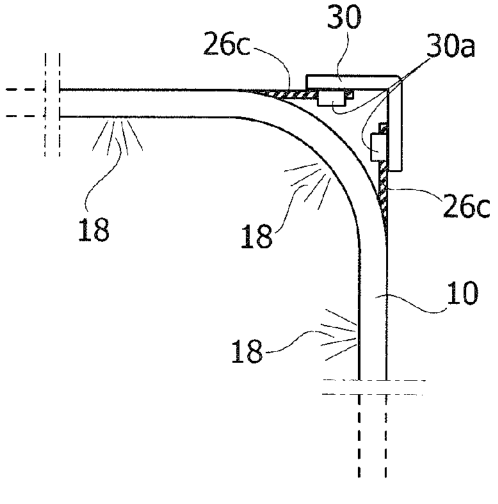

FIG. 15 shows by way of example the possibility to use a set square-like support 30, as shown in FIG. 12 and FIG. 13, bearing hooking/fixing elements 30*a* to link between them not just two differing modules 10, but two consecutive portions of the same module 10.

In the case shown by way of example, the two consecutive portions of the same module 10 are arranged at an angle (for example at 90°) with respect to one another, with one portion of the module 10 bent like an arc and from which respective portions of wire-like elements 26*c* that can be joined to the support element 30 emerge.

In the case of FIG. 15, too, as already seen in the case of FIG. 13, the connection, in addition to being mechanical, can also be electrical, and can be made using the same methods as those already described by way of example in relation to FIG. 13 and FIG. 14.

Returning to FIG. 5, in the various embodiments under consideration here the parallelism of the wire-like elements 26*c* can be ensured precisely as a result of the embedding in the "matrix" 26*b*, to which the wire-like elements 26*c* (be they conductive or non-conductive, located in a lateral or non-lateral position) confer qualities of rigidity.

When they are made of metallic material, for example steel, the elements 26*c* make it possible to implement a path of low ohmic value for the passage of electrical signals.

The examples presented in the figures illustrate the possibility to facilitate both the initial installation operation and also any subsequent modification operations for the installation.

Various embodiments therefore make it possible to achieve one or more of the following advantages:

- simplification of the installation and maintenance operations, for example in the case of LED modules,
- greater reliability of the fixing compared with the solutions which provide for the use of an adhesive tape, with possible risks of detachment being eliminated,
- preservation of the optical features over time, without jeopardizing the latter on the part of the support structure, which does not interfere with the light radiation sources,
- possibility to achieve a minimum esthetic impact (the mounting structure is virtually invisible),
- greater flexibility of the installation operations and the possibility for the user to implement suspended mounting solutions, with the possibility, if need be, to also implement two-dimensional and three-dimensional installations,
- greater safety in the case of suspended installation, with rather light installation solutions and/or thin structures, in such a way that, in addition to a reduced esthetic impact, there is a reduced surface exposed to the wind, which reduces the wind loading and the risk of violent stresses in the case of adverse atmospheric occurrences,
- possibility to use flex-type ribbon-like modules for suspended applications as an alternative to single lighting points, with the resulting possibility to utilize a greater distribution homogeneity of the light produced.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of installing at least one lighting module, the at least one lighting module comprising:

a ribbon-like containment body with a web wall having a first and a second face opposite to each other and a pair of side walls extending sidewise of the first face of the web wall to define a channel-like shape of the containment body;

a ribbon-like mounting board for mounting at least one light radiation source, the mounting board being arranged in the channel-like shape of the containment body with a mounting surface facing away from the first face of the web wall of the containment body; and the at least one said light radiation source mounted on the mounting surface of the mounting board for projecting light radiation from the channel-like shape of the containment body;

wherein the at least one lighting module includes a pair of flexible hook-like profiles protruding from and along the second face of the web wall of the containment body to permit mounting of the at least one lighting module by hooking to a ribbon-like mounting element, where said mounting element is hung or fixed on a mounting surface or support; and wherein the pair of flexible hook-like profiles comprises distal portions that are oriented toward the inside of the lighting module, and therefore toward one another, so as to jointly define a hooking formation the method comprising:

providing the ribbon-like mounting element having a transverse width corresponding to the distance between the hook-like profiles of the at least one lighting module;

mounting the mounting element onto a mounting surface or support; and coupling the at least one lighting module to the ribbon-like mounting element by hooking the at least one lighting module to the mounting element by means of said hook-like profiles.

2. The method of claim 1, further comprising:

selecting the mounting element as one of:

a support strip;

a strip portion of a support body; and a plurality of wires coupled into a strip.

3. The method of claim 1, further comprising:

selecting the mounting element as a plurality of wires coupled into a strip along the sides thereof.

4. The method of claim 3, wherein said wires include an electrically conductive material, whereby said wires are adapted to transmit electricity along the lighting module.

5. The method of claim 4, further comprising electrically connecting the wires of a plurality of mounting elements.

6. The method as claimed in claim 5, wherein the electrical connection is made by piercing connectors.

7. The method as claimed in claim 1, wherein the pair of flexible hook-like profiles support the weight of the ribbon-like containment body.

8. The method as claimed in claim 1, wherein the pair of flexible hook-like profiles comprise a proximal portion extending away from the web wall of the ribbon-like containment body, and a distal portion extending in a direction substantially parallel to the web wall of the ribbon-like containment body.

9. A method of installing at least one lighting module, the at least one lighting module comprising:

a ribbon-like containment body with a web wall having a first and a second face opposite to each other and a pair of side walls extending sidewise of the first face of the web wall to define a channel-like shape of the containment body;

a ribbon-like mounting board for mounting at least one light radiation source, the mounting board being arranged in the channel-like shape of the containment body with a mounting surface facing away from the first face of the web wall of the containment body; and the at least one said light radiation source mounted on the mounting surface of the mounting board for projecting light radiation from the channel-like shape of the containment body;

wherein the at least one lighting module includes a pair of flexible hook-like profiles protruding from and along the second face of the web wall of the containment body to permit mounting of the at least one lighting module by hooking to a ribbon-like mounting element, where said mounting element is hung or fixed on a mounting surface or support;

the method comprising:

providing the ribbon-like mounting element having a transverse width corresponding to the distance between the hook-like profiles of the at least one lighting module;

selecting the mounting element as a plurality of wires coupled into a strip along the sides thereof;

mounting the mounting element onto a mounting surface or support; and coupling the at least one lighting module to the ribbon-like mounting element by hooking the at least one lighting module to the mounting element by means of said hook-like profiles.

10. The method of claim 9, further comprising:

selecting the mounting element as one of:

a support strip;

a strip portion of a support body; and a plurality of wires coupled into a strip.

11. The method of claim 10, wherein said wires include an electrically conductive material, whereby said wires are adapted to transmit electricity along the lighting module.

12. The method of claim 11, further comprising electrically connecting the wires of a plurality of mounting elements.

13. The method as claimed in claim 12, wherein the electrical connection is made by piercing connectors.

14. The method as claimed in claim 9, wherein the pair of flexible hook-like profiles support the weight of the ribbon-like containment body.

15. The method as claimed in claim 9, wherein the pair of flexible hook-like profiles comprise a proximal portion extending away from the web wall of the ribbon-like containment body, and a distal portion extending in a direction substantially parallel to the web wall of the ribbon-like containment body.

16. A method of installing at least one lighting module, the at least one lighting module comprising:

a ribbon-like containment body with a web wall having a first and a second face opposite to each other and a pair of side walls extending sidewise of the first face of the web wall to define a channel-like shape of the containment body;

a ribbon-like mounting board for mounting at least one light radiation source, the mounting board being arranged in the channel-like shape of the containment body with a mounting surface facing away from the first face of the web wall of the containment body; and the at least one said light radiation source mounted on the mounting surface of the mounting board for projecting light radiation from the channel-like shape of the containment body;

wherein the at least one lighting module includes a pair of flexible hook-like profiles protruding from and along the second face of the web wall of the containment body to permit mounting of the at least one lighting module by hooking to a ribbon-like mounting element, where said mounting element is hung or fixed on a mounting surface or support; and wherein the pair of flexible hook-like profiles support the weight of the ribbon-like containment body from two sides of the second face of the web wall of the containment body the method comprising:

providing the ribbon-like mounting element having a transverse width corresponding to the distance between the hook-like profiles of the at least one lighting module;

mounting the mounting element onto a mounting surface or support; and coupling the at least one lighting module to the ribbon-like mounting element by hooking the at least one lighting module to the mounting element by means of said hook-like profiles.

* * * * *